United States Patent [19]

Nishizawa et al.

[11] 4,450,468
[45] May 22, 1984

[54] GALLIUM ARSENIDE ISL GATE WITH PUNCHED-THROUGH BIPOLAR DRIVER TRANSISTOR

[75] Inventors: Junichi Nishizawa; Tadahiro Ohmi, both of Miyagi, Japan

[73] Assignee: Handotai Kenkyu Shinkokai, Sendai, Japan

[21] Appl. No.: 411,121

[22] Filed: Aug. 24, 1982

Related U.S. Application Data

[63] Continuation of Ser. No. 116,415, Jan. 29, 1980, abandoned.

[30] Foreign Application Priority Data

Jan. 31, 1979 [JP] Japan .................................. 54-10828

[51] Int. Cl.³ ..................... H01L 27/04; H03K 19/091
[52] U.S. Cl. ........................................ 357/51; 357/13; 357/15; 357/22; 357/43; 357/58; 357/92; 307/458; 307/302
[58] Field of Search ..................... 357/92, 43, 15, 22, 357/51, 13, 58; 307/458, 302

[56] References Cited

U.S. PATENT DOCUMENTS

| Re. 29,971 | 4/1979 | Nishizawa et al. | 357/22 |
| 4,032,962 | 6/1977 | Balyoz | 357/92 |
| 4,216,490 | 8/1980 | Ohki | 357/41 |
| 4,234,803 | 11/1980 | Nonaka | 307/446 |
| 4,317,127 | 2/1982 | Nishizawa | 357/22 |

FOREIGN PATENT DOCUMENTS

| 2734996 | 2/1978 | Fed. Rep. of Germany | 357/92 |
| 2807181 | 8/1978 | Fed. Rep. of Germany | 357/22 E |
| 55-46548 | 4/1980 | Japan | 357/43 |

OTHER PUBLICATIONS

Japan J. Appl. Physics, vol. 16, Suppl. 16-1, pp. 151-154, (1977), (357-392).
IEEE ISSCC, Dig. Tech. Papers, pp. 168-169, (Feb. 1975), Peltier, "C3L".

Primary Examiner—William D. Larkins
Attorney, Agent, or Firm—Sughrue, Mion, Zinn, Macpeak and Seas

[57] ABSTRACT

A gallium arsenide semiconductor integrated circuit having a driver transistor constructed as a normally-configured bipolar mode static induction transistor having an n+ source region provided in a main or outer surface thereof and having an n+ buried region which serves as a drain region thereof. A bipolar, an insulated gate field-effect transistor or a resistor may be employed as a load for the driver transistor. Both the driver transistor and the load are formed on a semi-insulating substrate, preferably a p-type high resistivity material. Schottky diodes may be provided at the output terminals of the driver transistor so that wired-OR and wired-NOR logic functions may be readily implemented.

3 Claims, 19 Drawing Figures

GALLIUM ARSENIDE ISL GATE WITH PUNCHED-THROUGH BIPOLAR DRIVER TRANSISTOR

This is a continuation of application Ser. No. 116,415 filed Jan. 29 1980 now abandoned.

DESCRIPTION OF THE PRIOR ART

This invention relates to integrated circuits employing gallium arsenide electrostatic induction transistors.

The mobility of GaAs is about six or seven times as great as that of Si room temperature. Accordingly, it is well-known in the art that the operating speed of an integrted circuit constructed with GaAs is six or seven times as high as that of an integrated circuit constructed with Si, the speed being almost in proportion to the ratio of the mobilities.

It is difficult to produce a high quality crystal of GaAs, and techniques for fabrication process of GaAs integrated circuits are not fully developed as yet. Therefore, fabrication of integrated circuits using GaAs heretofore has only reached the level of complexity typified by the use of Schottky gate field-effect transistor on a semi-insulating substrate (hereinafter referred to as "a Mesfet" when applicable). However, in a MESFET produced by forming a thin n layer on a semi-insulating substrate by epitaxial growth, the electron flow is mainly in the vicinity of the interface between the epitaxial layer and the semi-insulating substrate and, accordingly, the mobility is substantially decreased and the performance of the device cannot be expected to greatly improve. Furthermore, there are a variety of uncontrollable states at the interface which makes the operation unstable. The uniform thin epi-layer thickness is very difficult to realize in the n on semi-insulating substrate. Thus, it is quite difficult to manufacture a large number of MESFET's having uniform operating characteristics and it has been almost impossible to produce large scale integrated circuits (hereinafter referred to as "LSI's" when applicable) using this material Even though the available techniques for processing GaAs have proved inadequate as described above, LSI's can be nonethless produced by utilizing static induction transistor (hereinafter referred to as "SIT" when applicable) integrated circuits which use normally-off junction gate SIT's (hereinafter, this device is called bipolar mode SIT (BSIT) as driver transistors and have circuit configuration equivalent to that of an I²L (integrated-injection logic) device (hereinafter referred to as "SIT I²L": U.S. patent application "GaAs semiconductor device", 35460/1979). An SIT I²L can be produced by forming an n⁻ layer on an n+ on p substrate including n+ buried region by epitaxial growth and by forming p+ and n+ regions at predetermined positions by ion implantation of S, Se, Be, Cd and so on. Furthermore, the B SIT operating characteristics do not require severe dimensional accuracy as shown in FIG. 1, where the drain and gate current are plotted as a function of the forward gate bias voltage for 10 samples in normal operation in FIG. 1(a) and in inverse operation in FIG. 1(b). Those data are obtained by using the sample as shown in FIG. 2, where the epi-layer thickness is 2.6 $\mu$m, the epi-layer impurity concentration is $4.5 \times 10^{13}$ cm$^{-3}$, total surface n+ region length is 130 $\mu$m, the p+ gate diffusion depth is 2.2 $\mu$m and the p$^{30}$ gate to gate spacing is 6 $\mu$m at mask level. In the normal operation, the surface n+ region serves as the source region and the n+ substrate serves as the drain region and vice versa in the inverse operation. Thus, LSI's can be manufactured using SIT integrated circuit techniques (SIT I²L) according to the prior fabrication process. However, the SIT I²L is still disadvantageous in that, as the structure of the driver transistor is necessarily of the inversely operating transistor (inverse operation), the current gain is liable to become small due to the existence of large gate current, thus increasing the gate to source diffusion capacitance. FIG. 1 indicates that the gate current in the inverse operation is larger than that in the normal operation by about one order of magnitude. The large gate to source capacitance of the driver transistor naturally limits the speed performance of the integrated circuit. The gate to source capacitance Cg's rapidly increases with increasing the forwrd gate bias voltage at a certain voltage as shown in FIG. 3, where the value of Cg's is plotted as a function of the gate bias voltage for three samples such as ST3, ST2 and ST1. The structure of ST3 is completely similar to that shown in FIG. 2. In ST2, the gate to gate spacing is set at 5 $\mu$m in FIG. 2. As for ST1, the epi-layer thickness is 4.9 $\mu$m and other remaining structure parameters are equal to those in FIG. 2. There remains the n⁻ high resistivity region of about 2.5 $\mu$m between the p+ gate region and the n+ substrate, so that the value of Cg's in ST1 at zero gate bias voltage is smaller than those in ST2 and ST3. However, it becomes larger than those at the forward gate bias voltages higher than about 0.5 V, because the minority carrier storage effect in ST1 is more remarkable compared to those in ST2 and ST3. The values of Cg's are plotted as a function of the gate current for three samples in the normal operation and in the inverse operation in FIG. 4. It is seen from FIG. 4 that the value of Cg's is smaller in the normal operation than in the inverse operation at the same gate current level. Moreover, FIG. 1 indicates that the current gain is higher in the normal operation than in the inverse operation. These results indicate that the value of Cg's is much smaller in the normal operation than in the inverse operation. Thus, the normal operation of B SIT is very suitable to high speed operation.

Accordingly, an object of this invention is to eliminate the above-described difficulties accompanying the prior art. More specifically, an object of the invention is to provide a GaAs integrated circuit operating at high speed in which a normally configured B SIT is employed as its driver transistor.

SUMMARY OF THE INVENTION

These, as well as other objects of the invention, may be met by providing a gallium arsenide semiconductor integrated circuit having a driver transistor including a normally configured bipolar mode static induction transistor in which a source region is provided in a main surface thereof and a buried region is employed as a drain region thereof. For a load of the driver transistor, a bipolar transistor, an insulated gate field-effect transistor or a resistor may be employed. Preferably, both the normally-configured driver transistor and the load transistor are formed on a semi-insulating substrate. The normally-configured driver transistor and the load transistor are preferably formed on a p-type high resistance substrate. At least one output terminal of the transistor is preferably formed as a Schottky electrode so that wired-OR or wired-NOR logic functions may be implemented.

BRIEF DESCRIPTION OF THE DRAWINGS

Specifically,

FIG. 5b is a cross-sectional view of the device of FIG. 5a;

FIG. 7b shows a circuit configuration of the integrated circuit shown in FIG. 7a;

DESCRIPTION OF THE PREFERRED EMBODIMENTS

Figure 5A:
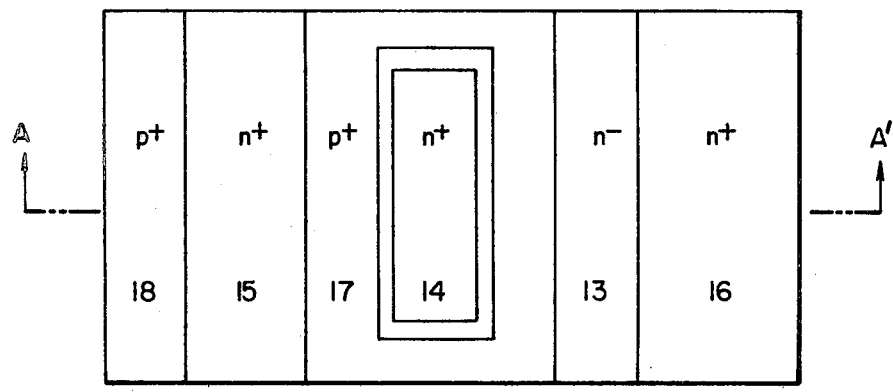
FIG. 5a is a plan view of an integrated circuit showing one embodiment of a GaAs static induction transistor integrated circuit according to the invention.
Figure 5B:
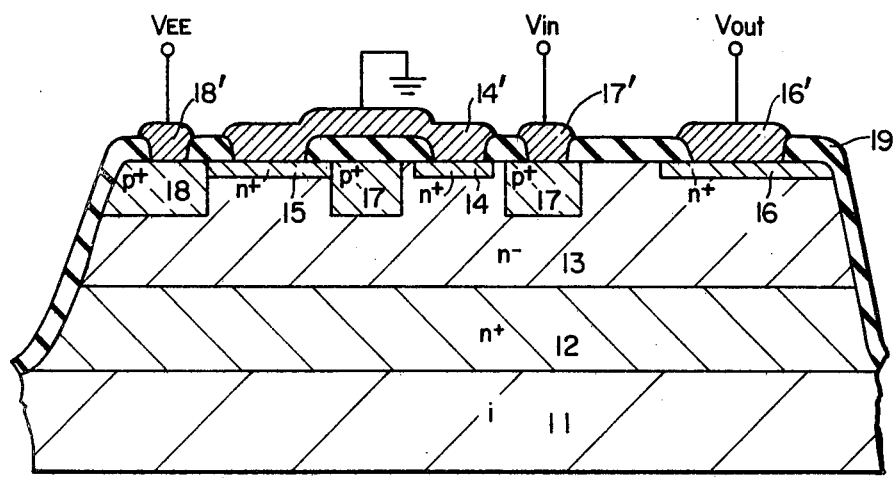
Figure 5C:
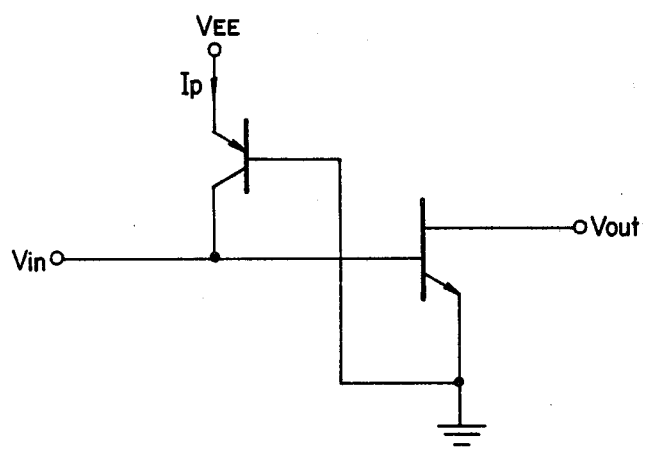
FIG. 5c shows a circuit configuration of the device of FIGS. 5a and 5b.

FIGS. 5a and 5b show a first embodiment of an integrated circuit according to the invention employing GaAs B SIT in the normal operation as a driver transistor where the circuit configuration of which is shown in FIG. 5c. More specifically, FIG. 5a is a plan view of the integrated circuit, FIG. 5b is a crosssectional view taken along line A—A' of FIG. 5a, and FIG. 5c is its circuit configuration.

In the integrated circuit shown in FIGS. 5a–5c, an injector (load) transistor is a pnp lateral bipolar transistor and the driver transistor is an n-channel BSIT in the normal operation. Various regions such as an n+ buried drain region 12, an n− region 13, n+ regions 14, 15 and 16, and p+ regions 17 and 18 are formed on a semi-insulating substrate 11. The n+ region 14 is the source region of the driver BSIT, the n+ region 15 is the base electrode region of the lateral bipolar transistor, and the n+ region 16 is the drain electrode region of the normally-configured BSIT. The p+ region 17 is the gate region of the BSIT, and the p+ region 18 is the emitter region of the lateral bipolar transistor. The p+ region 17 serves as the collector of the lateral bipolar transistor. In FIGS. 5a and 5b, reference numerals 18', 14', 16' and 17' designate the emitter electrode, the source electrode, the drain electrode and the gate electrode, respectively. The base of the lateral bipolar transistor is directly connected to the source of the BSIT through the respective electrodes. Reference numeral 19 designates an insulating layer such as $SiO_2$, $Si_3N_4$, $Al_2O_3$, AlN, $GAO_xN_y$, or combination of these insulating materials. The emitter is connected to the positive voltage source $V_{EE}$ while the source is grounded. An input voltge $V_{in}$ having a high level is applied to the gate of the BSIT, in response to which an output voltage $V_{out}$ having a low level is produced at the drain electrode. Thus, the integrated circuit shown in FIG. 5 is single-input and single-output inverter arrangement. If the input voltage $V_{in}$ is at a high level, for instance 0.7 to 1.3 volts, then the BSIT is rendered conductive and the output voltage $V_{out}$ is at a low level, for instance 0.1 to 0.5 volts. When the input voltage $V_{in}$ is set to the low level, then the BSIT is rendered non-conductive and the level of the output voltage $V_{out}$ rises to the high level.

FIG. 5b illustrates the case where the n− and n+ regions 12, 13 surrounding this inverter unit are removed by etching for the separation of each unit. The surface of the integrated circuit can be made substantially flat by filling the etched regions with an insulating resin such as polyimide. The integrated circuit illustrated in FIG. 5b can be manufactured in accordance with the following process. First, the n+ layer and the n− layer are continuously formed on the semi-insulating substrate to predetermined thicknesses and impurity densities by epitaxial growth. Then, the n+ regions are formed by the implantation of ions such as S or Se while the p+ regions are formed by the implantation of ions such as Be or Cd. Thereafter, etching is carried out for separating each unit. Finally, metal wiring is carried out.

Figure 6:
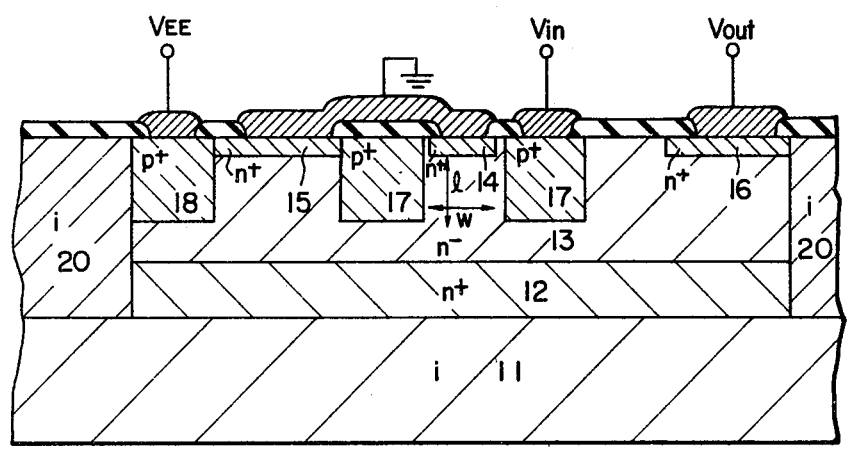
FIG. 6 is a cross-sectional view of a second embodiment of an integrated circuit of the invention.

Another embodiment of the structure which implements the circuit shown in FIG. 5c is as illustrated in FIG. 6. In the structure shown in FIG. 6, the inverter units are separated by converting the n− and n+ regions into semi-insulating regions 20 by proton bombardment. Since the surface of the structure is originally flat, wiring thereto can be easily achieved. In the structures shown in FIGS. 5a and 5b and 6, the n+ region 12 forms the buried drain region and the drain electrode is provided on the n+ region 16 appearing in the surface. If the resistance between the n+ regions 16 and 12 should become a problem, the depth of the n+ region 16 may be increased. As the n+ region 12 is formed on the semi-insulating substrate, the capacitance of the n+ region 12 is very small, which enhances the high speed operation of this integrated circuit.

The BSIT employed as the driver transistor must be of the normally "off" type. Accordingly, a ratio of "l" to "w" as indicated in FIG. 6 must be larger than about 0.7 in order to realize the normally-off device even when the impurity concentration in the n⁻ region 13 is very small such as $10^{12}$–$10^{15}$ cm⁻³. Moreover, the value of $N_D W^2$ must be smaller than $3 \times 10^7$ cm⁻¹, where $N_D$ is the impurity concentration in the n⁻ region 13. Then, in such situation, a sufficiently high potential barrier is provided in the channel so that no appreciable drain current flows when the gate is at the low level and the drain is at the high level. Both of the n⁺ and p⁺ regions have a doping density of the order of $10^{17}$ to $10^{20}$ cm⁻³ while the n⁻ region is of the order $10^{12}$ to $10^{15}$ cm⁻³. The value of W is usually designed less than 3 μm. The channel dimension must be designed smaller than the electron or hole diffusion length. The n⁺ region 12 is separated from the p⁺ gate region 17 in the embodiments shown in FIGS. 5 and 6. However, these regions may be substantially or completely in contact with each other as desired.

As the driver BSIT is of the normally-configured type, its transconductance is high, its resistance is low during conduction, and its frequency charcteristics and driving capability are excellent. Since GaAs is a direct transition-type crystal, its electron and hole recombination speed is quite high. The switching speed of a junction-type BSIT strongly depends on the storge effect of holes which are injected primarily from the gate region into the channel. Accordingly, in GaAs material for which the electron and hole recombination speed is extremely high, the minority carrier storge effect is greatly lowered and then high speed switching is attainable.

Figure 7A:
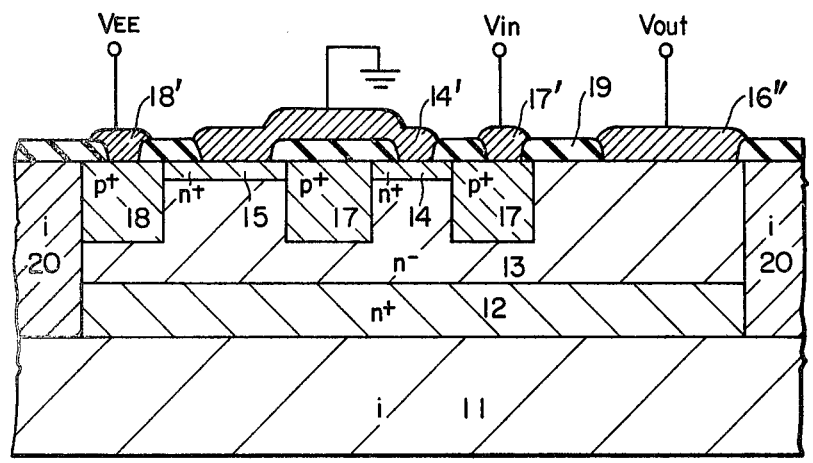
FIG. 7a is a cross-sectional view of a third embodiment of an integrated circuit device of the invention.
Figure 7B:
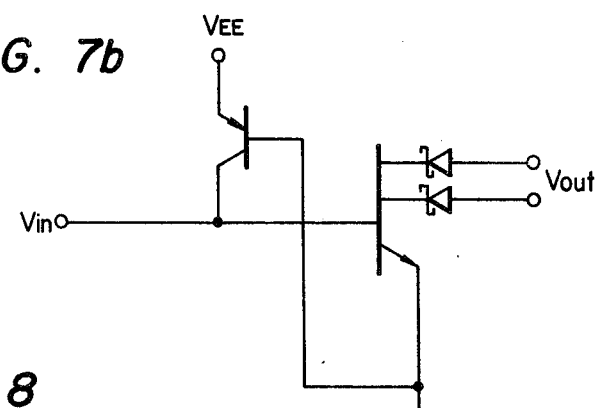

A single-input and single-output inverter has been described as above. Usually, an integrated circuit constructed in accordance with the invention may be utilized in various logical operation as wired-OR and wired-NOR logic. Accordingly, for single-input and single output devices, the structures shown in FIGS. 5a–5c and 6 are suitable. However, for wired-OR or wired-NOR logic between units each having a single input and multiple outputs, the structures shown in FIGS. 5a–5c and 6 are not suitable, that is, wired-OR or wired-NOR logic cannot be implemented because the output terminals cannot be independent from one another. Wired-OR or wired-NOR logic with multiple outputs can be implemented by providing the output terminal with Schottky diodes as in the circuit configuration shown in FIG. 7b. That is, an introduction of a desired number of Schottky diode electrodes 16" at the drain region of one driver BSIT can form a unit having multiple output terminals as shown in FIG. 7b. Although the Schottky diodes are connected as described above, the output terminals are electrically separated from one another and wired-OR and wired-NOR logic can thus be implemented. In FIG. 7a, reference numeral 16" designates the Schottky electrode which is made of a metal such as Pt, Cr, Mo, Ti, Al or W. In FIG. 7a, two Schottky diodes are provided in the perpendicular direction which are not illustrated in the figure.

With the output terminals connected to the Schottky diodes as described above, if the forward voltage drop $V_f$ is excessively high, then the voltage difference between the low level and the high level of the output voltage becomes small and the noise immunity consequently decreases. Accordingly, it is preferable that the forward voltage drop $V_f$ of Schottky diode must be designed as low as possible, as long as no appreciable current may flow thermally in a reverse direction.

Figure 8:
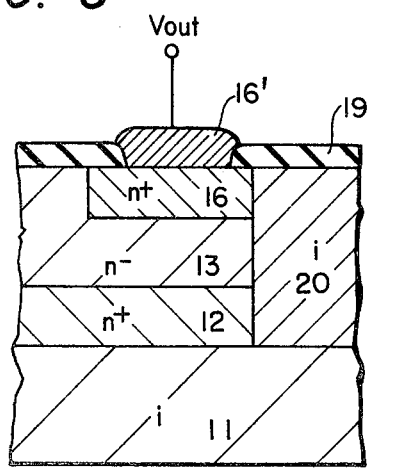
FIG. 8 is a cross-sectional view of a fifth example of an integrated circuit according to the invention.

A structure shown in FIG. 8 can be used to substantially decrease the value of $V_f$ in some case. For simplification of the figure, only the drain output terminal region is shown. As is clear from FIG. 8, a Schottky electrode is provided on an n⁺ region 16. Therefore, if the impurity density of the n⁺ region 16 is high, current flows in a tunnel mode and the voltage $V_f$ substantially decreases. As the voltage $V_f$ decreases, the noise immunity as a result increases and also the frequency characteristic of driver BSIT becomes excellent, because the gate to drain junction is not deeply biased in a forward direction.

While the invention has been described with reference to preferred embodiments, it is obvious that a static induction transistor integrated circuit using GaAs according to the invention is not limited thereto or thereby. The above-described semi-insulating substrate may be replaced by a p⁻ substrate. Furthermore, the injector transistor may be replaced by an insulated gate (MOS) FET. In the latter case, an independent potential may be applied to the gate of the MOSFET or it may be coupled directly to the source or the drain of the MOSFET. That is, all that is necessary is that provision of a structure wherein the driver transistor is formed with a normally configured BSIT on a semi-insulating substrate or a p⁻ substrate.

In the embodiments shown in FIGS. 5, 6 and 7, the lateral p⁺n⁻p⁺ bipolar transistor serves as a load transistor, where the distance between the emitter and the collector is chosen so as to deplete almost the n⁻ base region in order to prevent the recombination of holes injected from the p⁺ emitter region 18 in the n⁻ base region. However, the performance of the GaAs p⁺n⁻p⁺ lateral bipolar transistor such as base grounded current gain is not so good, so that an introduction of the resistor as a load is very useful to improve the performance of the integrated circuit of the invention.

Figure 9A:
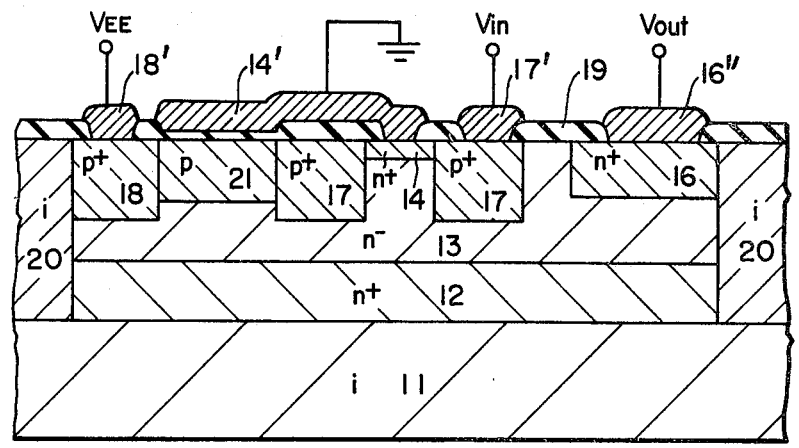
FIG. 9a is a cross-sectional view of a sixth embodiment of an integrated circuit device of the invention, where the resistance serves as a load.

FIG. 9a illustrates a cross-sectional view of an integrated circuit of the invention having a resistor as a load, where p region 21 is introduced. The electrode 14' is set at the surface of the p region 21 through the insulator layer. The p⁺ (18)-p(21)-p⁺(17) serves as a resistor. The existence of the electrode 14' on the p region 21 tends to cause the accumulation of holes at the surface of the p region 21, thus decreasing the value of the resistor. The value of the resistor is approximately determined by the dimension and the impurity concentration of the p region 21.

Figure 9B:
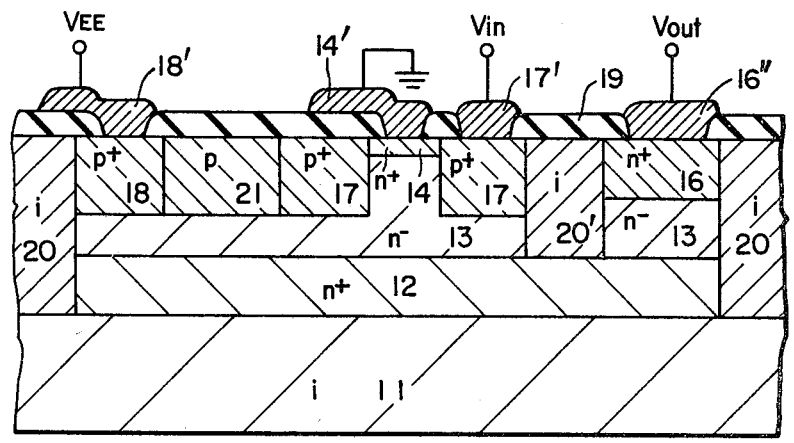
FIG. 9b is a cross-sectional view of a seventh embodiment of an integrated circuit device of the invention, where the resistance serves as a load.

FIG. 9b illustrates a cross-sectional view of another embodiment of an integrated circuit device of the invention having a resistor as a load, which is basically similar to that shown in FIG. 9a. In the structure shown in FIG. 9b, there does not exist the electrode on the p region 21, where the region adjacent to the p⁺ gate region 17 is converted to the semi-insulating region 20' by proton bombardment in order to increase the current gain of the driver BSIT and decrease the minority carrier storage effect.

Figure 10A:
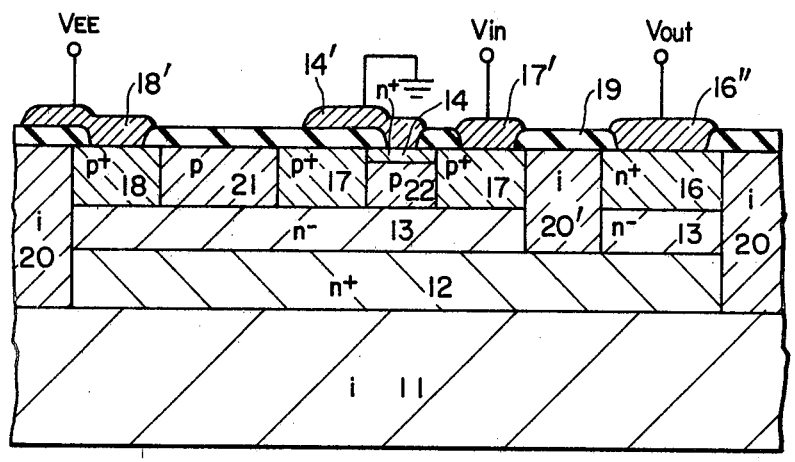
FIG. 10a is a cross-sectional view of a eighth embodiment of an integrated circuit device of the invention.

So far, the channel region of the driver BSIT consists of the n⁻ region, so that the ratio of the channel length l to the gate to gate spacing W must be designed larger than 0.7 even if the impurity concentration in the channel is decreased as small as possible. In order to improve the performances of BSIT such as higher speed switching, higher transconductance, smaller on resistance and so on, the BSIT must have shorter channel structure. In order to realize the shorter channel structure, an introduction of the p region 22 into the channel is effective, as shown in FIG. 10a, where the dimension and the impurity concentration ration of the p region are chosen so as that this p region 22 is almost or completely covered by the depletion layer for zero gate bias operation. An existence of the p region in the channel obviously increases the potential barrier height in the channel with increasing the impurity concentration, so that the ratio of the channel at zero gate bias operation length l to the gate spacing W can be decreased less than 0.7 with keeping the potential barrier in the channel. In an extreme case, the value of l/W can be 0.1–0.3. Since the p region 22 is covered by the depletion layer, the potential profile in this region is controlled by the gate voltage and the drain voltage through capacitive coupling but not through the base resistance. The potential control through the base resistance is very popular in the conventional bipolar transistor, where the potential barrier height in the cross-sectional direction of the channel becomes maximum at the channel center due to the voltage drop across the base resistance in the symmetric structure. On the contrary, the potential barrier height in the cross-sectional direction of the channel becomes minimum at the channel center in the symmetric structure. The impurity concentration in the p region 22 is set at $10^{14}$–$10^{17}$ cm$^{-3}$ and the value of W is also designed less than 3 $\mu$m. The impurity concentration in the p region 21 is set around at $10^{14}$–$10^{18}$ cm$^{-3}$.

So far, the structure of the driver BSIT shown in FIGS. 5, 6, 7, 9 and 10a has a symmetric structure. The structure of the driver BSIT is not necessarily symmetric. In order to decrease the gate to source capacitance and the gate to drain capacitance and improve the speed performance, the dimensions of the p+ gate region 17 are desirably made as small as possible.

Figure 10B:
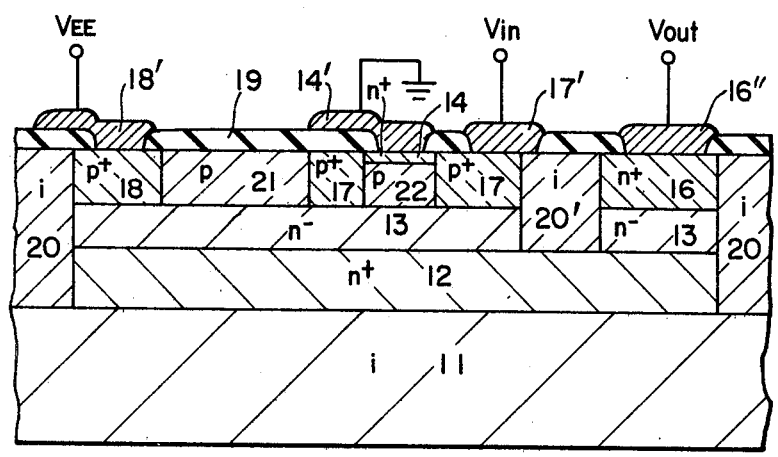
FIG. 10b is a cross-sectional view of a nineth embodiment of an integrated circuit device of the invention.

In the structure shown in FIG. 10b, the p+ gate region 17 is made smaller compared to the previous embodiments except the portion for the gate electrode contact 17'.

Figure 11:
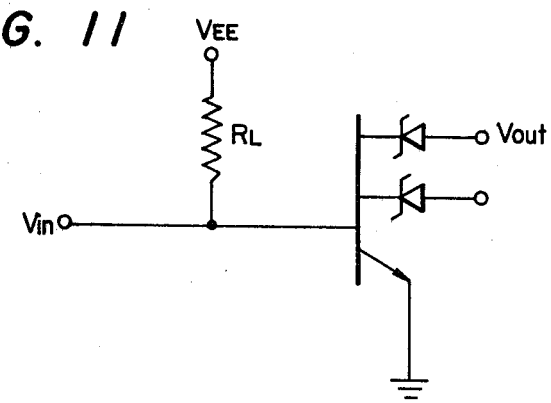
FIG. 11 is a circuit configuration of the devices shown in FIGS. 9a, 9b, 10a and 10b.
Figure 12A:
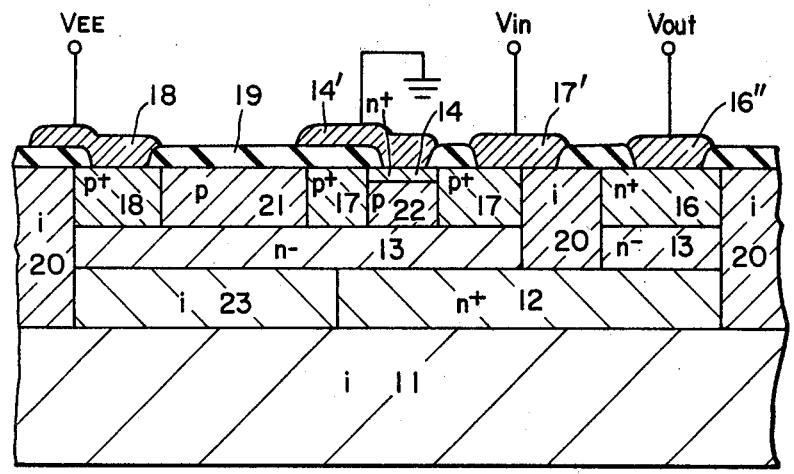
FIG. 12a is a cross-sectional view of a tenth embodiment of an integrated circuit device of the invention.
Figure 12B:
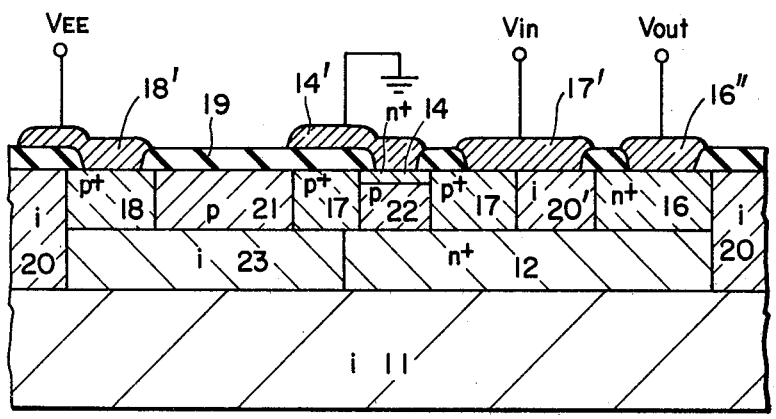
FIG. 12b is a cross-sectional view of an eleventh embodiment of an integrated circuit device of the invention.

FIG. 11 is a circuit configuration for the integrated circuits of the invention shown in FIGS. 9a, 9b, 10a and 10b, where the resistor $R_L$ serves as a load. If the current flowing through the resistor $R_L$ is $I_{on}$, the n+ drain region voltage is approximately given by {$V_{EE}$−(R$_L I_{on}+V_f$)}, where $V_f$ is the voltage drop of the Schottky diode. When the value of ($R_L I_{on}+V_f$) approached the value of $V_{EE}$, there appears an excess current flowing through the p+(18)n+(12) junction. This excess current increases power dissipation and decreases the operational speed. This excess current is almost completely removed in the embodiments shown in FIGS. 12a and 12b, where the n+ region 12 under the p+ region 18 is converted to the semi-insulating region by proton bombardment. In the structure shown in FIG. 12b, there does not exist the high resistivity region between the p+ gate region 17 and the n+ region 12. In other fabrication process, the n+ region 12 can be produced by ion implantation of S or $S_t$ to the semi-insulating substrate and annealing.

In the structures shown in FIGS. 9a, 9b, 10a, 10b, 12a and 12b, the load resistor is provided in the semiconductor region. It is obviously possible that the load resistor is provided on the insulator film 19 by using the resistive material such as polysilicon.

With the use of GaAs, the characteristics of the device regarding the fact that the transconductance of a normally-configured BSIT is high and its frequency characteristics are quite excellent, are further improved due to the magnitude of the mobility and the value of the electron and hole recombination speed. As the n+ buried drain region is provided on or in the semi-insulting substrate, the capacitance of its region is small and the high speed characteristics are further imposed.

The BSIT used here is a device in which the drain current density easily becomes very large. The drain voltage at the onset of the current saturation is very low, about 0.1–0.2 volt or lower so that the impedance of the BSIT is very low. The magnitude of electron mobility in GaAs further improves this property of the BSIT. That is, a device having properties such as quite low in impedance and high in current density is provided. Accordingly, a source current density of the order of $1 \times 10^4$ A/cm$^2$ to $1 \times 10^5$ A/cm$^2$ can be easily obtained. For instance, with the structure shown in FIG. 10a with the following approximate parameter values, a propagation delay time of the order of 50 to 200 psec is obtained with a power consumption of the order of 10 $\mu$W:

Gate interval W: 0.8 $\mu$m
Channel length l: 0.8 $\mu$m
Impurity density: $5 \times 10^{14}$cm$^{-3}$
Source length of one unit: 3 $\mu$m
Epitaxial thickness: 1.2 $\mu$m
Drain n+ layer thickness: 0.5 $\mu$m The speed performance can be further improved by decreasing the channel length and increasing the impurity concentration, for example, such as with l=0.2 $\mu$m and $N_A = 8 \times 10^{16}$ cm$^{-3}$.

Figure 1B:
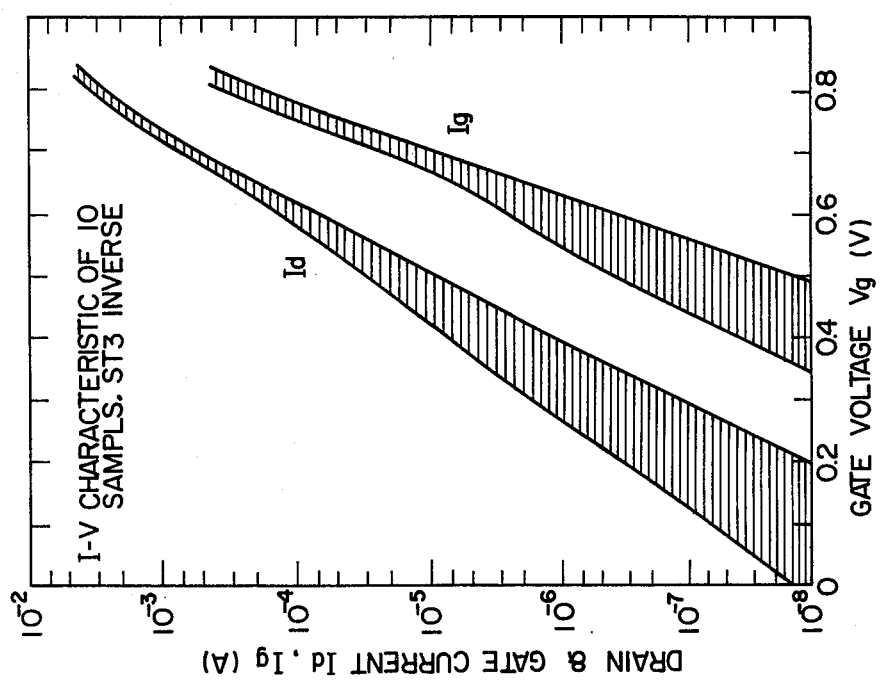
FIG. 1b shows a relationship of the drain current Id and the gate current Ig to the forward gate bias voltge Vg of the bipolar mode SIT (BSIT) in the inverse operation, where data of 10 samples are plotted by shading.
Figure 1A:
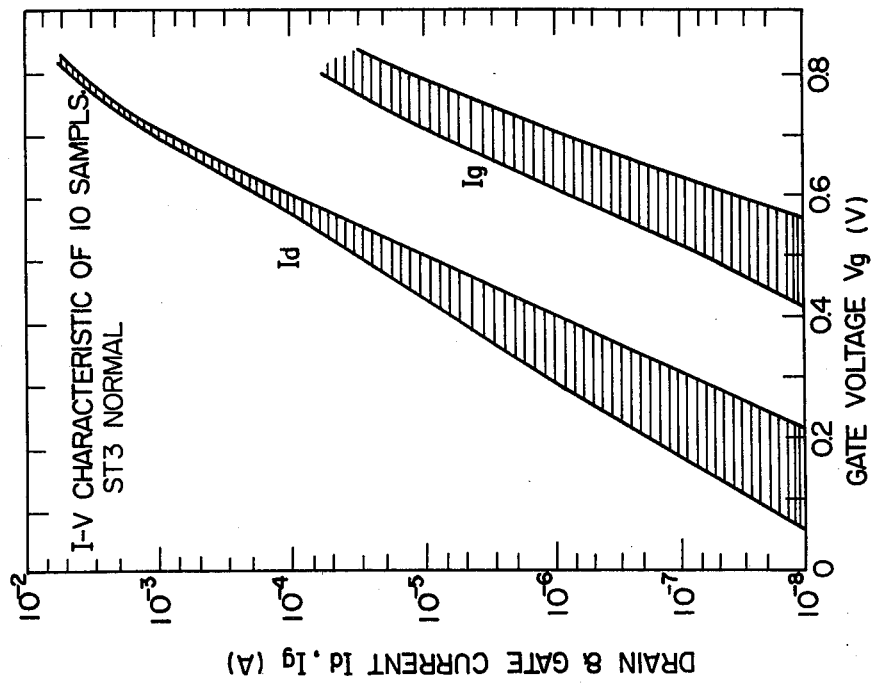
FIG. 1a shows a relationship of the drain current Id and the gate current Ig to the forward gate bias voltage Vg of the bipolar mode SIT (BSIT) in the normal operation, where data of 10 samples are plotted by shading.
Figure 2:
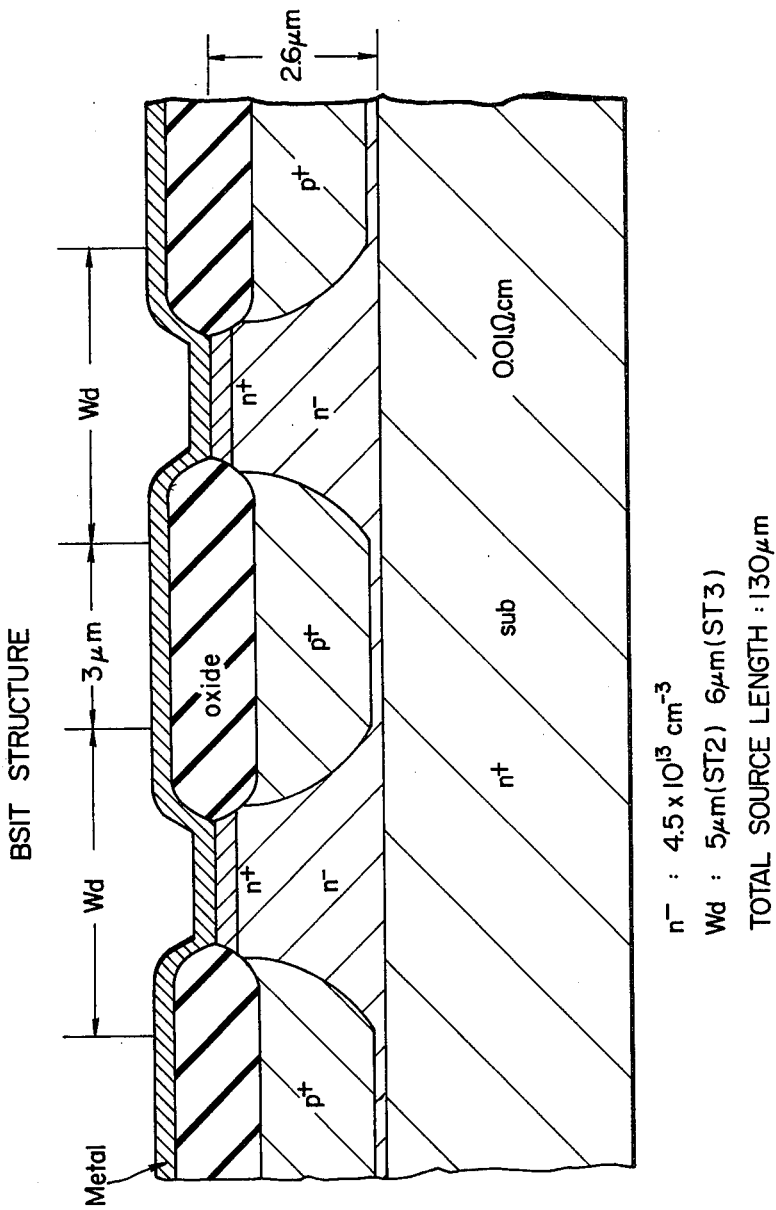
FIG. 2 is a cross-sectional view of the device evaluating the performance of BSIT, where the device consists of five channels having a length in the perpendicular direction of 30 μm and the gate to gate spacing at mask level of 5 μm (ST2) and 6 μm (ST3)
Figure 3:
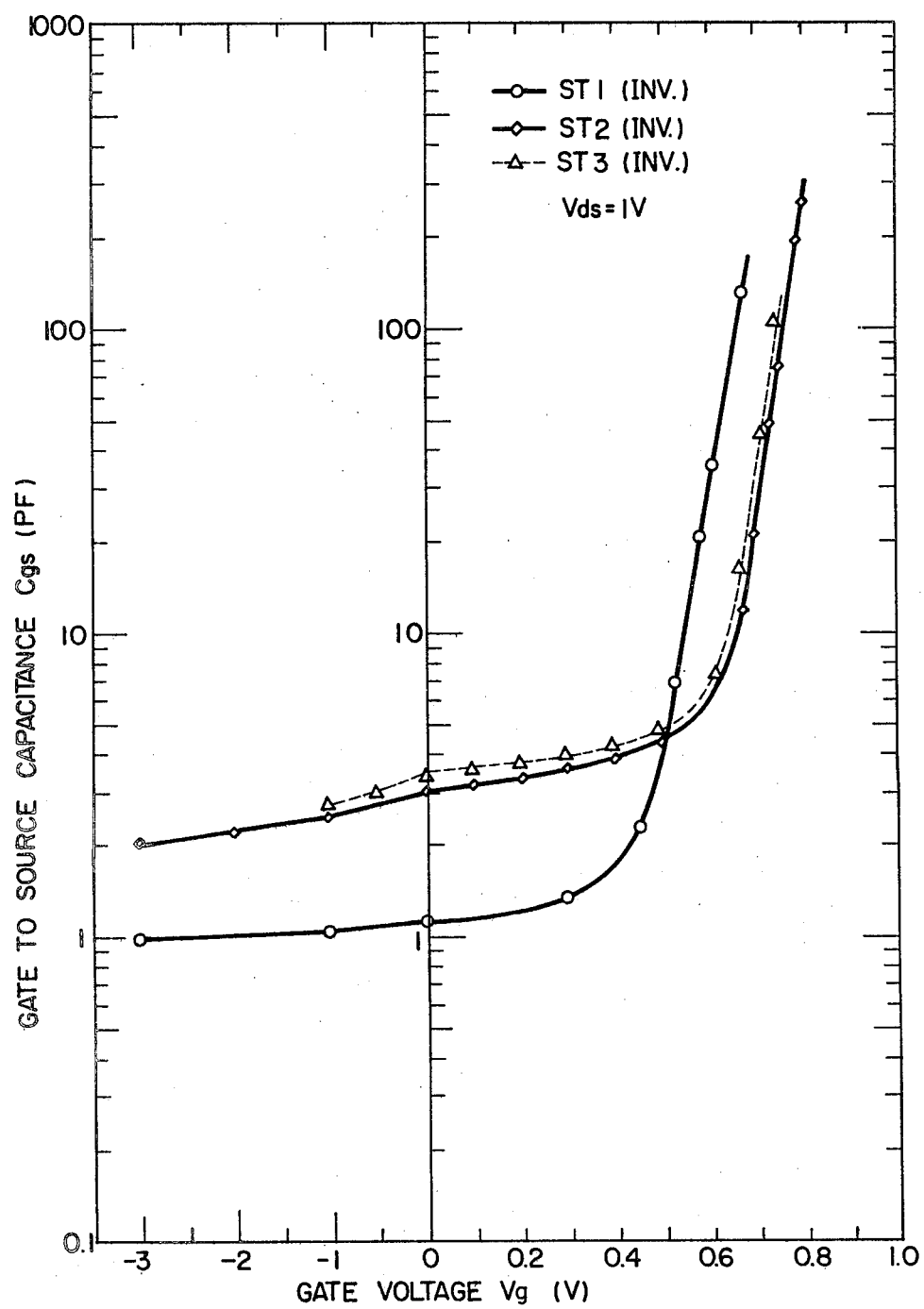
FIG. 3 shows the relation between the gate to source capacitance Cg's and the gate voltage Vg of three samples in the inverse operation such as ST1, ST2 and ST3.
Figure 4:
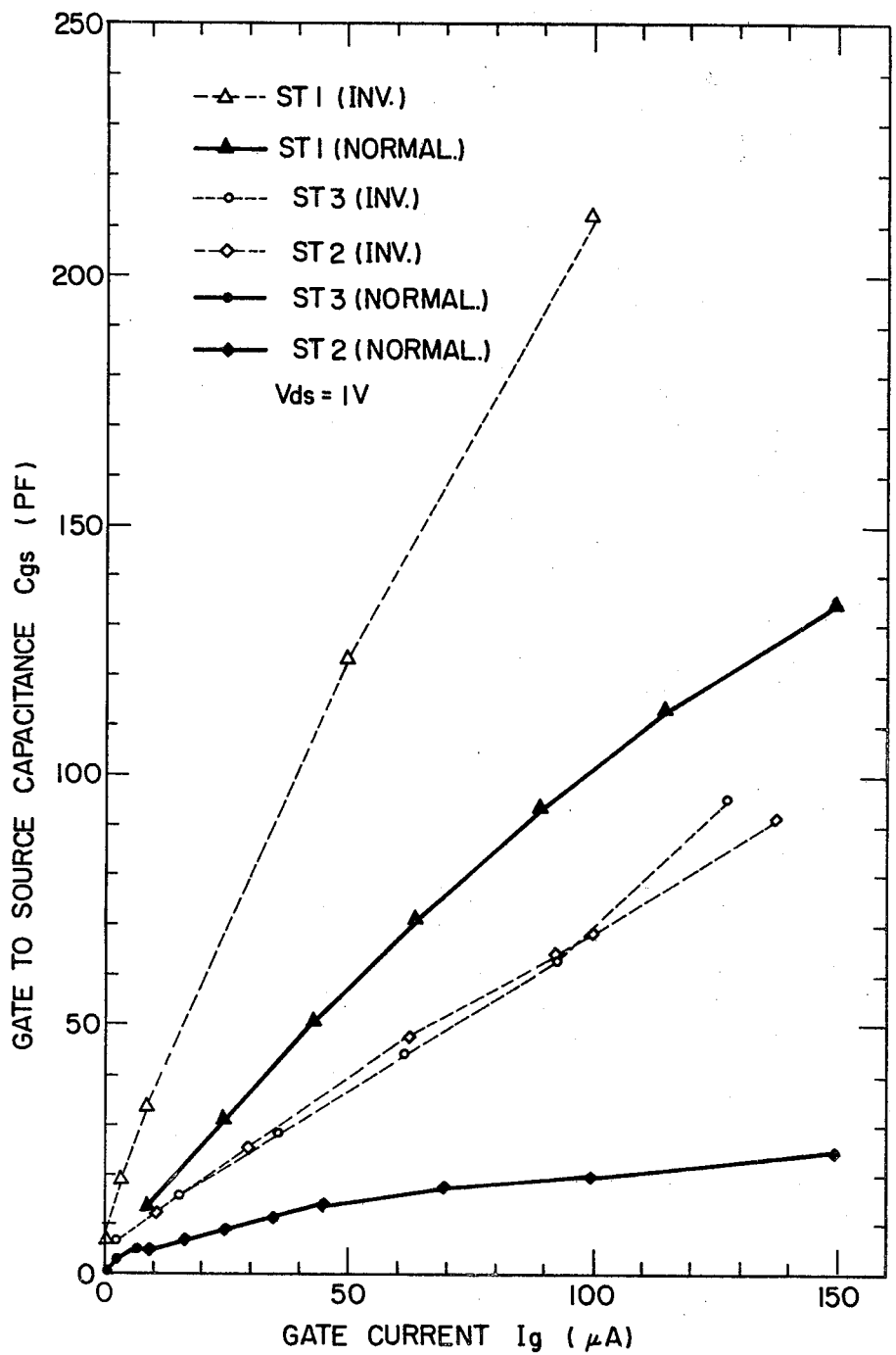
FIG. 4 shows the relation between the gate to source capacitance Cg's and the gate current Ig of three samples such as ST1, ST2 and ST3 in the inverse and the normal operation.

The BSIT's are devices which have large dimensional tolerances as described previously referring the results shown in FIG. 1. Accordingly, GaAs SIT integrated circuits of the invention using the normally-configured BSIT's can be readily manufactured as large scale integration devices. Furthermore, such integrated circuits can be readily manufactured as large scale integration devices because the manufacturing process thereof is simple. The fundamental structure thereof can be produced by epitaxial growth techniques with ion implantation of the n+ and p+ regions. The integrated circuit can be produced by subjecting the fundamental structure to etching or proton bombardment for separation of the units and conventional wiring techniques. In other words, the operation of an integrated circuit of the invention is hardly at all affected by the interface of the semi-insulating substrate. Thus, devices quite uniform in operating characteristics may be manufactured over a large area.

As a GaAs SIT integrated circuit according to the invention is formed on the semi-insulating substrate, the operation thereof is not affected by the interface between the active the active material and the substrate. Furthermore, the BSIT has large dimensional tolerances. Accordingly, one of the specific feature of an integrated circuits of the invention resides in the fact that they can be readily manufactured as large scale integration devices. As a normally-configured BSIT is employed as the driver transistor, the operating speed of the device is quite high.

What is claimed is:

1. A gallium arsenide static induction transistor integrated circuit formed in a semiconductor body comprising:

a semi-insulating substrate; an epitaxial layer grown on said semi-insulting substrate; a static induction transistor; and a resistor connected as a load of said static induction transistor, and resistor and said static induction transistor being formed on said epitaxial layer;

wherein said static induction transistor comprises an n+ source region formed in contact with a main surface of said epitaxial layer; a p+ gate region formed in contact with said main surface of said epitaxial layer with said gate region substantially surrounding said source region; an n+ buried drain region adjacent to said semi-insulating substrate; a low impurity concentration current path region substantially surrounded by said source, gate and drain regions, said current path region including a low impurity p region adjacent to at least said source region, said current path region having dimensions and impurity concentrations so as to be completely covered with a depletion region at a zero, off-state gate bias; and at least one Schottky contact connected as an output terminal to said drain region; and wherein said resistor comprises a p region formed in contact with said main surface of said epitaxial region; and at least a semi-insulating region between said p region and said semi-insulating substrate.

2. The gallium arsenide integrated circuit as claimed in claim 1 further comprising a low impurity n− region disposed between said p region and said semi-insulating substrate.

3. The galluim arsenide integrated circuit as claimed in claim 2 wherein said low impurity n− region is immediately adjacent said p region.

* * * * *